(12) United States Patent
Heinrich et al.

(10) Patent No.: US 8,802,553 B2
(45) Date of Patent: Aug. 12, 2014

(54) METHOD FOR MOUNTING A SEMICONDUCTOR CHIP ON A CARRIER

(75) Inventors: Alexander Heinrich, Regensburg (DE); Konrad Roesl, Teublitz (DE); Oliver Eichinger, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 96 days.

(21) Appl. No.: 13/024,862

(22) Filed: Feb. 10, 2011

(65) Prior Publication Data
US 2012/0208323 A1 Aug. 16, 2012

(51) Int. Cl.
*H01L 21/00* (2006.01)

(52) U.S. Cl.
USPC ............. 438/612; 438/107; 257/E21.499

(58) Field of Classification Search
USPC ................. 438/612, 614, 615, 107
See application file for complete search history.

(56) References Cited

U.S. PATENT DOCUMENTS

| | | | |
|---|---|---|---|
| 3,695,501 A | | 10/1972 | Radobenko |
| 4,746,390 A | * | 5/1988 | Badalec et al. ............ 156/272.8 |
| 6,261,866 B1 | * | 7/2001 | Marinis et al. ................ 438/115 |
| 6,265,244 B1 | * | 7/2001 | Hayashi et al. ............... 438/106 |
| 6,306,684 B1 | | 10/2001 | Richardson et al. |
| 6,734,551 B2 | * | 5/2004 | Yoshihara et al. ............ 257/706 |
| 7,547,625 B2 | * | 6/2009 | Beyne et al. ................. 438/613 |
| 7,875,529 B2 | * | 1/2011 | Forbes et al. ................. 438/455 |
| 2005/0250245 A1 | * | 11/2005 | Riedl et al. .................... 438/106 |
| 2006/0192295 A1 | * | 8/2006 | Lee et al. ....................... 257/778 |
| 2008/0164300 A1 | * | 7/2008 | Alcoe et al. ............. 228/180.22 |
| 2011/0233792 A1 | * | 9/2011 | Zhang et al. .................. 257/778 |

* cited by examiner

*Primary Examiner* — Reema Patel
(74) *Attorney, Agent, or Firm* — Slater & Matsil, L.L.P.

(57) ABSTRACT

A method includes providing a semiconductor chip having a first main surface and a layer of solder material deposited on the first main surface, wherein the layer of solder material has a roughness of at least 1 μm. The semiconductor chip is placed on a carrier with the first main surface of the semiconductor chip facing the carrier. The semiconductor chip is pressed on the carrier with a pressure of at least 1 Newton per mm² of surface area of the first main surface and heat is applied to the solder material.

24 Claims, 7 Drawing Sheets

METHOD FOR MOUNTING A SEMICONDUCTOR CHIP ON A CARRIER

TECHNICAL FIELD

This invention relates to a method for mounting a semiconductor chip on a carrier, in particular, a leadframe.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated in wafers, which are then singulated to produce semiconductor chips. Subsequently, the semiconductor chips may be mounted on electrically conductive carriers, such as leadframes. During the mounting process, the semiconductor chip may be subject to thermal stress which may damage the semiconductor chip.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1A:
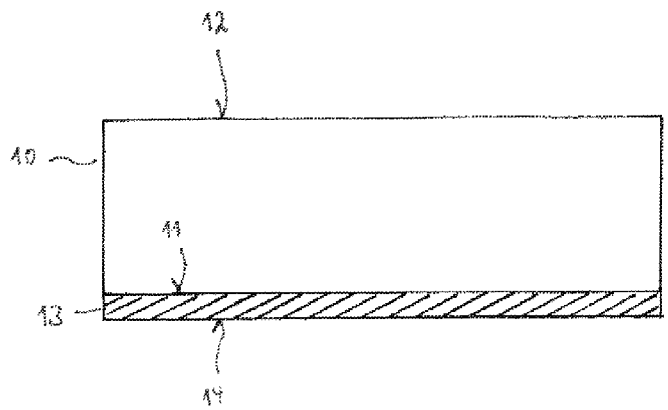
FIGS. 1A-1C schematically illustrate a cross-sectional view of one embodiment of a method for mounting a semiconductor chip on a carrier.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing semiconductor chips are described below. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, microphones etc. Moreover, the semiconductor chips may be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact pads, in particular, on its two main surfaces, that is to say on its top side and bottom side. In particular, power semiconductor chips may have a vertical structure. By way of example, the source electrode and gate electrode of a power MOSFET may be situated on one main surface, while the drain electrode of the power MOSFET is arranged on the other main surface. The semiconductor chips need not be manufactured from specific semiconductor material, for example, Si, SiC, SiGe, GaAs, and, furthermore, may contain inorganic and/or organic materials that are not semiconductors.

The semiconductor chips may have contact pads (or electrodes or contact elements) which allow electrical contact to be made with the integrated circuits included in the semiconductor chips. The contact pads may include one or more metal layers which are applied to the semiconductor material of the semiconductor chips. The metal layers may be manufactured with any desired geometric shape and any desired material composition. The metal layers may, for example, be in the form of a layer covering an area. Any desired metal or metal alloy, for example, aluminum, titanium, tungsten, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main surfaces of the semiconductor chips or on other surfaces of the semiconductor chips.

Solder material may be deposited on the semiconductor chips. For example, AuSn, AgSn, CuSn, Sn, AgIn, In, or CuIn may be used as the solder material. A surface of the solder material may have a certain roughness.

The semiconductor chips may be placed on carriers. The semiconductor chips may be pressed on the carriers such that solder material, which has previously been deposited on the semiconductor chips, is deformed and a form-closed joint between the semiconductor chips and the carriers is produced. The carriers may be of any shape, size and material. During the fabrication of the devices the carriers may be connected to each other. The carriers may also be made from one piece. The carriers may be connected among each other by connection means with the purpose of separating some of the carriers in the course of the fabrication. Separation of the carriers may be carried out by mechanical sawing, a laser beam, cutting, stamping, milling, etching or any other appropriate method. The carriers may be electrically conductive. They may be entirely fabricated from metals or metal alloys, in particular, copper, copper alloys, iron nickel, aluminum, aluminum alloys, steel, stainless steel or other appropriate materials. The carriers may be, for example, a leadframe or a part of a leadframe. Furthermore, the carriers may be plated with an electrically conductive material, for example, copper, silver, iron nickel or nickel phosphorus. In one embodiment, the carrier is a composite substrate, for example, a DCB (Direct Copper Bond), which is a ceramic substrate with copper layers on its top and bottom surface.

The devices described below may include external contact pads (or external contact elements), which may be of any shape and size. The external contact pads may be accessible from outside the devices and may thus allow electrical contact to be made with the semiconductor chips. Furthermore, the external contact pads may be thermally conductive and may serve as heat sinks for dissipating the heat generated by the semiconductor chips. The external contact pads may be composed of any desired electrically conductive material, for example, of a metal, such as copper, aluminum or gold, a metal alloy or an electrically conductive organic material. Solder material, such as solder balls or solder bumps, may be deposited on the external contact pads.

The semiconductor chips or at least parts of the semiconductor chips may be covered with an encapsulation material, which may be electrically insulating and which may form an encapsulation body. The encapsulation material may be any appropriate duroplastic, thermoplastic or thermosetting material or laminate (prepreg) and may contain filler materials. Various techniques may be employed to encapsulate the semiconductor chips with the encapsulation material, for example, compression molding, injection molding, powder molding, liquid molding or lamination. Heat and/or pressure may be used to apply the encapsulation material.

Figure 1B:
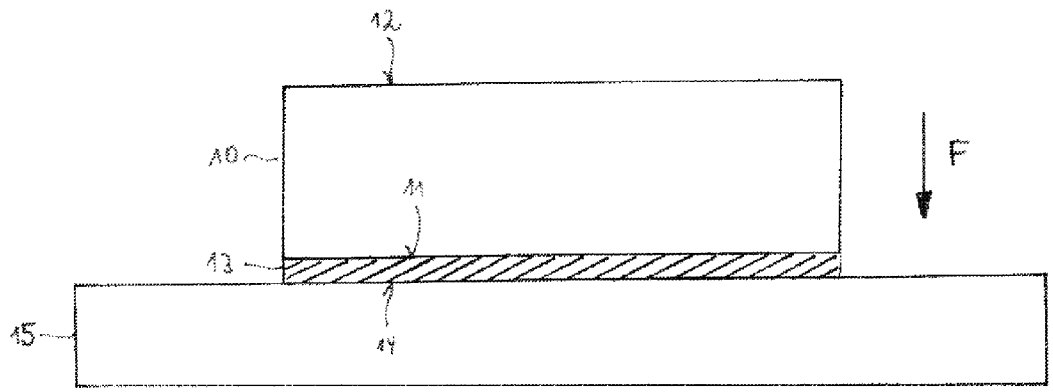
Figure 1C:
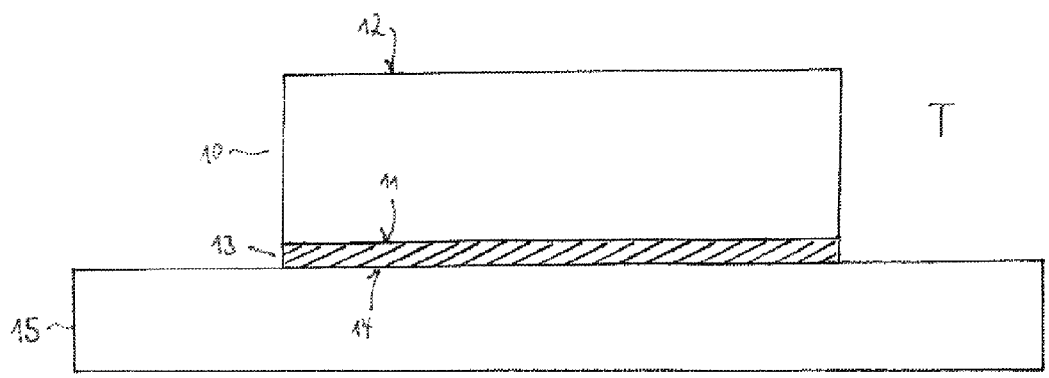

FIGS. 1A-1C schematically illustrate a method for mounting a semiconductor chip on a carrier.

FIG. 1A schematically illustrates a semiconductor chip 10 having a first main surface 11 and a second main surface 12 opposite to the first main surface 11. A layer of solder material 13 is deposited on the first main surface 11 of the semiconductor chip 10. The layer of the solder material 13, in particular a surface 14 of this layer facing away from the first main surface 11 of the semiconductor chip 10, may have a roughness of at least 1 μm.

FIG. 1B schematically illustrates a carrier 15 on which the semiconductor chip 10 is placed with the first main surface 11 of the semiconductor chip 10 facing the carrier 15. The semiconductor chip 10 is pressed on the carrier 15 with a force F such that a pressure of at least 1 Newton per $mm^2$ of surface area of the first main surface 11 is applied.

FIG. 1C schematically illustrates that the solder material 13 is heated to a temperature T in order to attach the semiconductor chip 10 to the carrier 15 firmly.

Figure 2A:
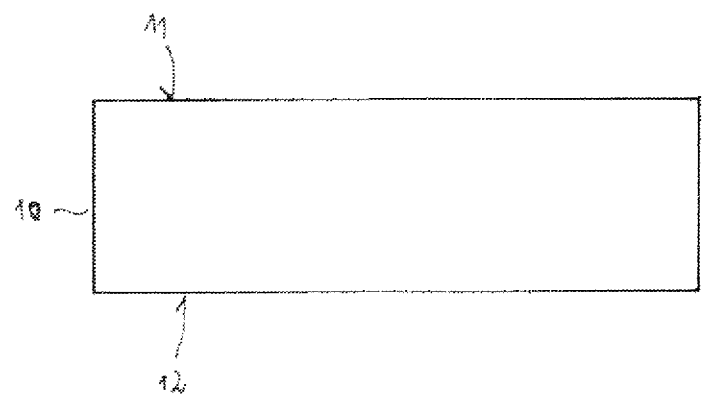
FIGS. 2A-2B schematically illustrate a cross-sectional view of one embodiment of a method for depositing solder material on a semiconductor chip.
Figure 2B:
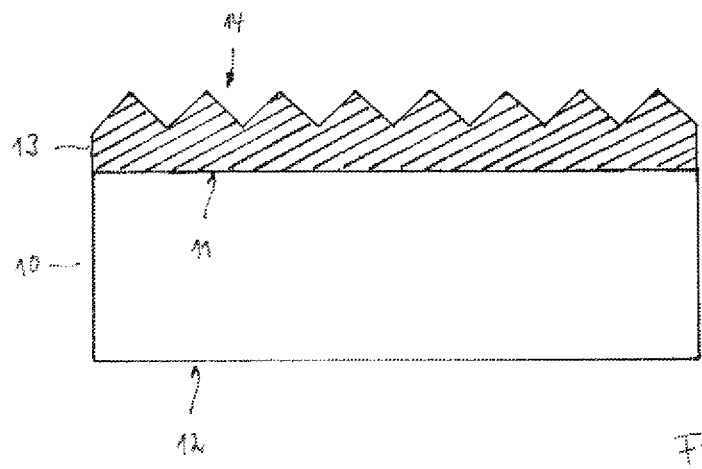

FIGS. 2A-2B schematically illustrate a method for depositing solder material on a semiconductor chip.

FIG. 2A schematically illustrates the semiconductor chip 10 in cross-section with its first main surface 11 facing upwards and its second main surface 12 facing downwards. A contact pad, which allows electrical contact to be made with the integrated circuits included in the semiconductor chip 10, may be located on the first main surface 11. The contact pad may be a doped region in the semiconductor material. According to one embodiment, the semiconductor chip 10 shown in FIG. 2A is still part of a semiconductor wafer. According to another embodiment, the semiconductor chip 10 has already been singulated from the semiconductor wafer.

FIG. 2B schematically illustrates a layer of solder material 13 deposited on the first main surface 11 of the semiconductor chip 10. The solder material 13 covers the contact pad located on the first main surface 11 of the semiconductor chip 10 and, in particular, may cover the entire first main surface 11. The surface 14 of the solder material 13 has a certain minimum roughness. For example, the surface 14 may have a roughness of at least 1 μm or 1.5 μm or 2 μm. The solder material 13 may contain any appropriate material, for example, Sn, AuSn, AgSn, CuSn, AgIn, In, or CuIn. If the semiconductor chip 10 is still in the wafer bond during the deposition of the solder material 13, the semiconductor chip 10 is singulated from the semiconductor wafer after the deposition of the solder material 13.

In one embodiment, the solder material 13 is deposited by using a sputtering process. In this case, the deposition rate is set to such a value that a desired surface roughness of the deposited solder material 13 is obtained.

In one embodiment, the solder material 13 is deposited by an electrochemical deposition process. For that purpose, a solution containing solder particles is applied to the semiconductor chip 10, and an appropriate voltage is applied between the semiconductor chip 10 and a reference electrode such that the solder particles deposit on the first main surface 11 of the semiconductor chip 10. In addition, the solution contains additives which also deposit on the first main surface 11. The solder layer 13 does not grow at locations where the additives have deposited which leads to the rough surface of the solder layer 13.

In one embodiment, the first main surface 11 of the semiconductor chip 10 has a certain surface roughness, which may, for example, be produced by an etching step. The layer of the solder material 13, which is subsequently deposited on the first main surface 11, has the same or a similar roughness than the first main surface 11.

Figure 3:
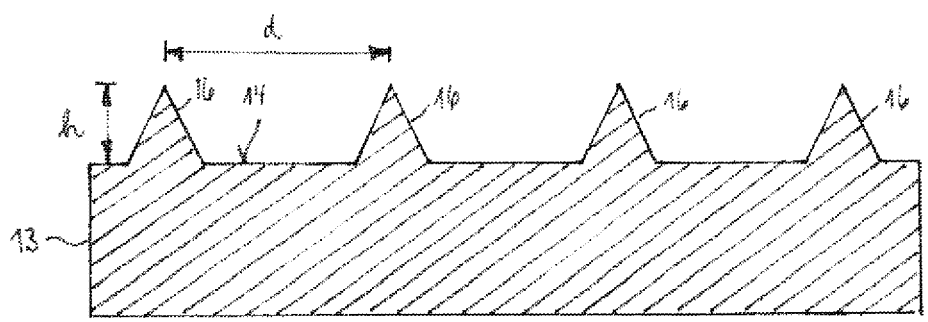
FIG. 3 schematically illustrates a rough surface of a layer of solder material.

FIG. 3 illustrates an idealized model of the surface roughness of the layer made of the solder material 13. In this model, the surface 14 of the layer has peaks 16 having an average height h and an average peak-to-peak distance d. The wave length of the roughness of the surface 14 may be in the order of the average peak height h. The wave length may be also significantly smaller than the dimensions of the first main surface 11. The average peak height h may be in the range from 1 μm to 5 μm and, in particular, in the range from 1 μm to 2 μm. The average peak-to-peak distance d may be in the range from 2 µm to 10 µm and, in particular, in the range from 3 µm to 5 µm. In particular, these values for the average peak height h and the average peak-to-peak distance d are valid when the first main surface 11 has a size of up to 10 mm². For larger surface areas the parameters of the surface roughness can be adapted. In one embodiment, the surface roughness of the layer made of the solder material 13 is characterized by the average peak height h. In one embodiment, the surface roughness of the layer made of the solder material 13 is characterized by the average peak height h and the average peak-to-peak distance d.

In one embodiment, the solder material 13 applied to the semiconductor chip 10 has a certain ductility. Ductility is a mechanical property that describes the extent in which solid materials can be plastically deformed without fracture. A measure for the ductility is the yield stress or the yield strength. The yield stress is the stress at the yield point. In practice, the yield stress is chosen such that it causes a permanent strain of 0.002. The yield strength is defined as the yield stress, which is actually the stress level at which a permanent deformation of 0.2% of the original dimension of the material happens, and is defined as the stress level at which a material can withstand the stress before it is deformed permanently. In one embodiment, the yield stress of the solder material 13 deposited on the semiconductor chip 10 has a yield stress in the range from 10 MPa to 200 MPa. In one embodiment, the yield strength of the solder material 13 deposited on the semiconductor chip 10 has a yield strength in the range from 10 MPa to 200 MPa.

The solder material 13 may be deposited directly onto the semiconductor material of the semiconductor chip 10 as illustrated in FIG. 2B.

Figure 4:
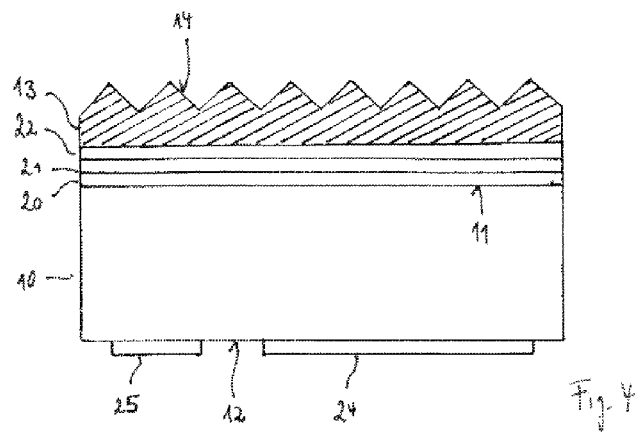
FIG. 4 schematically illustrates a cross-sectional view of one embodiment of semiconductor chip with several metal layers and a layer of solder material.

FIG. 4 schematically illustrates an embodiment where one or more metal layers are arranged between the semiconductor material of the semiconductor chip 10 and the layer of the solder material 13. In FIG. 4 metal layers 20, 21 and 22 are deposited on the first main surface 11 of the semiconductor chip 10 before the solder material 13 is applied to the metal layer 22. The metal layers 20-22 may be deposited by a vacuum deposition method, such as sputtering, or other appropriate physical or chemical deposition methods. Each of the metal layers 20-22 may have a thickness in the range from 50 to 300 nm, but may also be thinner or thicker. Aluminum, titanium, tungsten, gold, silver, copper, palladium, platinum, nickel, chromium, nickel vanadium or other appropriate metals or metal alloys may be used as the materials for the metal layers 20-22. In one embodiment, one or more additional metal layers are arranged between the metal layers 20 and 21 and/or the metal layers 21 and 22.

The metal layer 20 may serve to make an electrical contact to the semiconductor chip 10. The function of the metal layer 21 may be that of a diffusion barrier which protects the semiconductor material of the semiconductor chip 10 from the solder material 13 during the soldering process. The metal layer 22 may function as an adhesion layer, which enables the solder material 13 to adhere to the semiconductor chip 10.

According to one embodiment, the semiconductor chip 10 has a vertical structure and thus has contact pads or electrodes on both main surfaces 11 and 12. The semiconductor chip 10 shown in FIG. 4 has contact pads 24 and 25 located on the second main surface 12 opposite to the first main surface 11. The contact pads 24 and 25 may include one or more metal layers.

The semiconductor chip 10 may, for example, be a power semiconductor chip, such as a power transistor, a power diode or an IGBT. In the case of a power MOSFET, the contact pad located on the first main surface 11 is a drain electrode, and the contact pads 24 and 25 are source and gate electrode, respectively.

Figure 5:
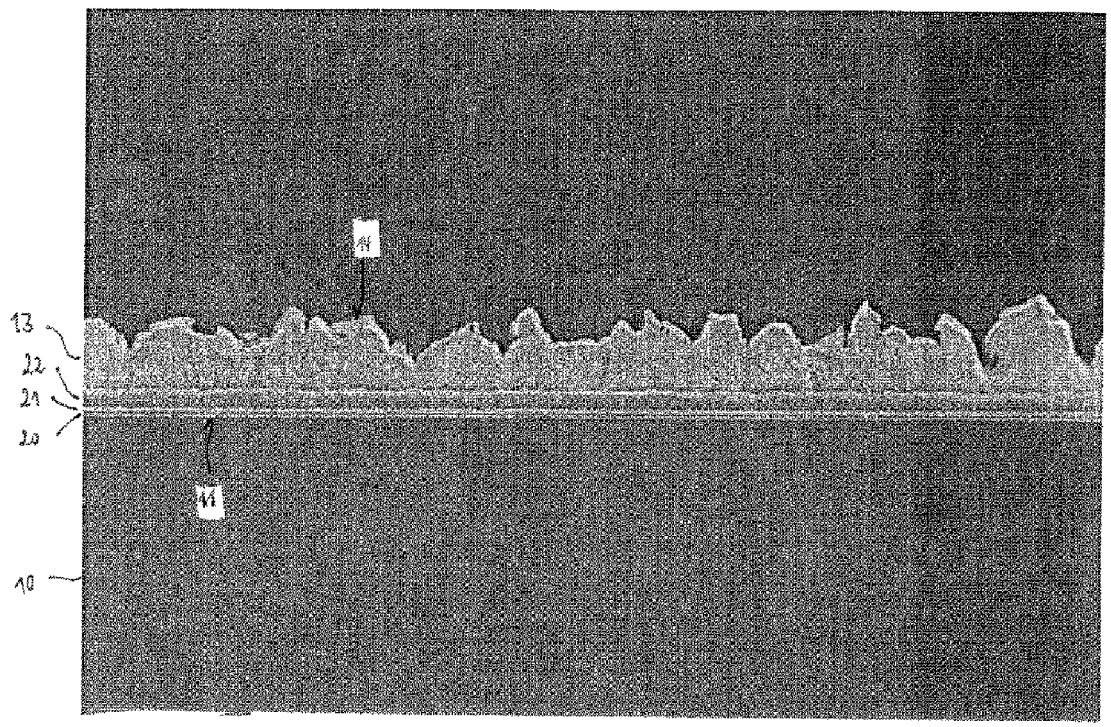
FIG. 5 shows an SEM (scanning electron microscope) image of a semiconductor chip with a layer of solder material.

FIG. 5 shows an SEM (scanning electron microscope) image of a semiconductor chip 10 as an example of the embodiment illustrated in FIG. 4. The following layers are deposited on the first main surface 11 of the semiconductor chip 10: a metal layer 20, a metal layer 21, a metal layer 22 and a layer of solder material 13 and having a rough surface 14.

Figure 6:
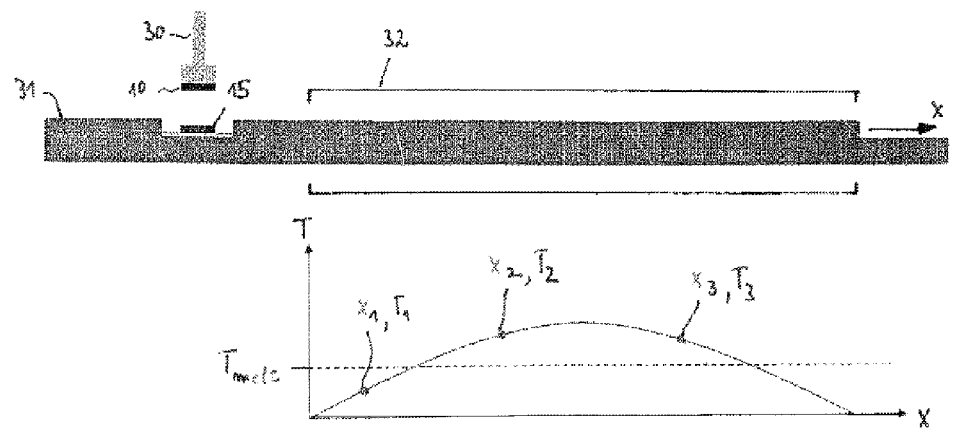
FIG. 6 illustrates a schematic view of an embodiment of a method for mounting a semiconductor chip on a carrier using a tunnel furnace.

FIG. 6 illustrates a schematic view of a method for mounting the semiconductor chip 10 on the carrier 15. FIG. 6 shows a die bonder 30 that picks up a single semiconductor chip 10 and places the semiconductor chip 10 on a carrier 15. The carrier 15 is positioned on a conveyor 31. The conveyor 31 is, for example, driven by a step motor and moves the carrier 15 together with the semiconductor chip 10 in a direction x shown in FIG. 6. After the placement of the semiconductor chip 10 on the carrier 15, the carrier 15 and the semiconductor chip 10 pass through a tunnel furnace 32. The temperature profile of the tunnel furnace 32 is also shown in FIG. 6. A temperature profile which is different from the tunnel profile shown in FIG. 6 may also be used. The temperature profile of the tunnel furnace 32 may, for example, include a portion with a rising temperature and a subsequent portion with a declining temperature.

FIGS. 7A-7E schematically illustrate the steps of the method of FIG. 6 in more detail.

Figure 7A:
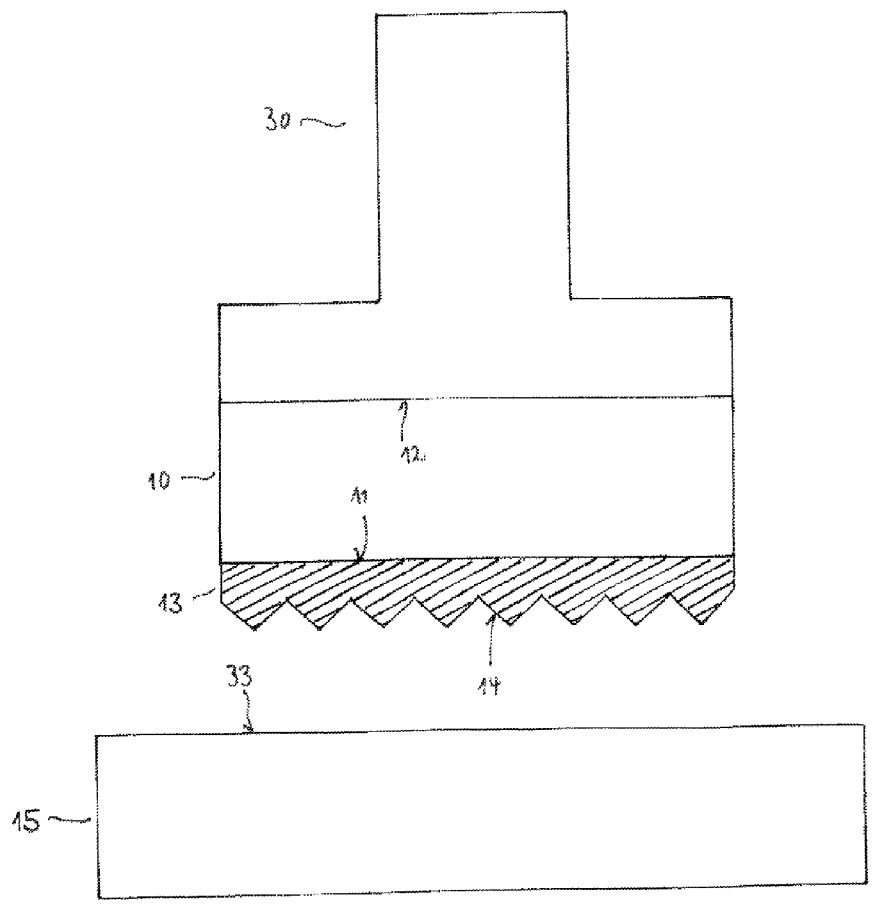
FIGS. 7A-7E schematically illustrate the steps of the method of FIG. 6 in more detail.

FIG. 7A schematically illustrates the die bonder 30, which picks up the semiconductor chip 10 at a loading position and moves the semiconductor chip 10 to the bonding position. The die bonder 30 holds the semiconductor chip 10 with its second main surface 12 such that the first main surface 11 of the semiconductor chip 10 and thus the layer of the solder material 13 face towards the carrier 15. In the embodiment of FIG. 7A, the solder material 13 is directly attached to the semiconductor chip 10. It may also be provided that one or more metal layers are arranged between the semiconductor chip 10 and the solder material 13 as illustrated, for example, in FIG. 4 or 5.

The carrier 15 may be made of an electrically conductive material, such as a metal or metal alloy, for example, copper, copper alloys, iron nickel or other appropriate materials. The carrier 15 may be a leadframe or a part of a leadframe, such as a die pad. Furthermore, the carrier 15 may be coated with an electrically conductive material, for example, copper, silver, iron nickel or nickel phosphorus. The carrier 15 has a surface 33, on which the semiconductor chip 10 is placed. In one embodiment, the carrier 15 is a composite substrate, for example, a DCB including a ceramic substrate and copper layers arranged on the top and the bottom surface of the ceramic substrate.

Figure 7B:
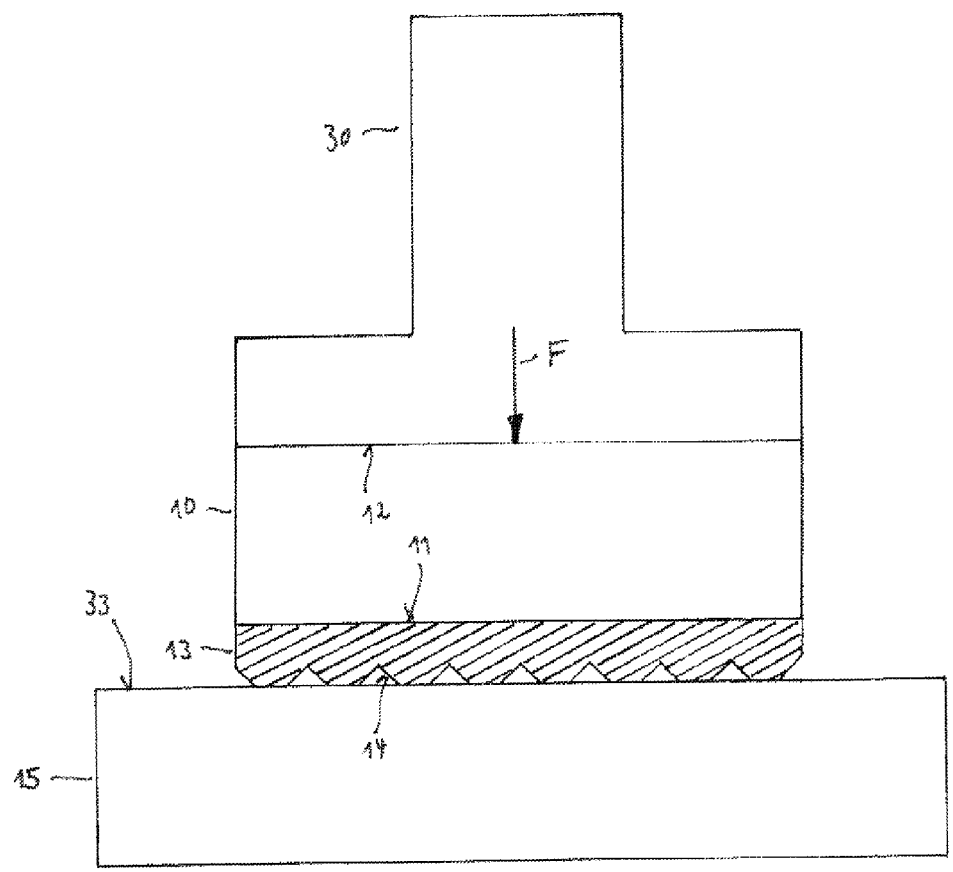

FIG. 7B schematically illustrates the die bonder 30, which places the semiconductor chip 10 on the surface 33 of the carrier 15. The die bonder 30 applies a force F onto the semiconductor chip 10 such that the semiconductor chip 10 is pressed on the carrier 15. The force F may be applied for at least 10 ms. It is also possible to apply the force F for much longer times. Since the process step illustrated in FIG. 7B does not involve a temperature step, the die attach time may be relatively short.

The force F causes a pressure on the solder material 13 of at least 1 Newton per mm² of the surface area of the first main surface 11. It may also be provided that a higher pressure is generated, for example, a pressure in the range from 3 to 100 Newton per mm² of the surface area of the first main surface 11. In one embodiment, the pressure may be higher than 2 or 3 or 5 or 10 Newton per mm².

Due to the rough surface 14 of the solder material 13, only some spots of the surface 14 (i.e., the peaks 16 shown in FIG. 3) are in contact with the carrier 15 when the semiconductor chip 10 is placed on the carrier 15. The pressure on the solder material 13 applied by the die bonder 30 is high enough to deform the solder material 13 locally and to produce a mechanical connection between the semiconductor chip 10 and the carrier 15. In particular, the pressure on the solder material 13 causes the portion of the solder material 13 that is in contact with the carrier 15 to penetrate into grooves in the surface 33 of the carrier 15, which are due to the manufacturing of the carrier 15. Thus the surface 14 of the solder material 13 adapts to the shape of the surface 33 of the carrier 15. This facilitates a mechanical bond, in particular a form-closed joint of the semiconductor chip 10 and the carrier 15.

The mechanical connection between the semiconductor chip 10 and the carrier 15 ensures that there is no shift in the position of the semiconductor chip 10 with respect to the carrier 15 when the step motor moves the conveyor 31 forward.

Figure 7C:
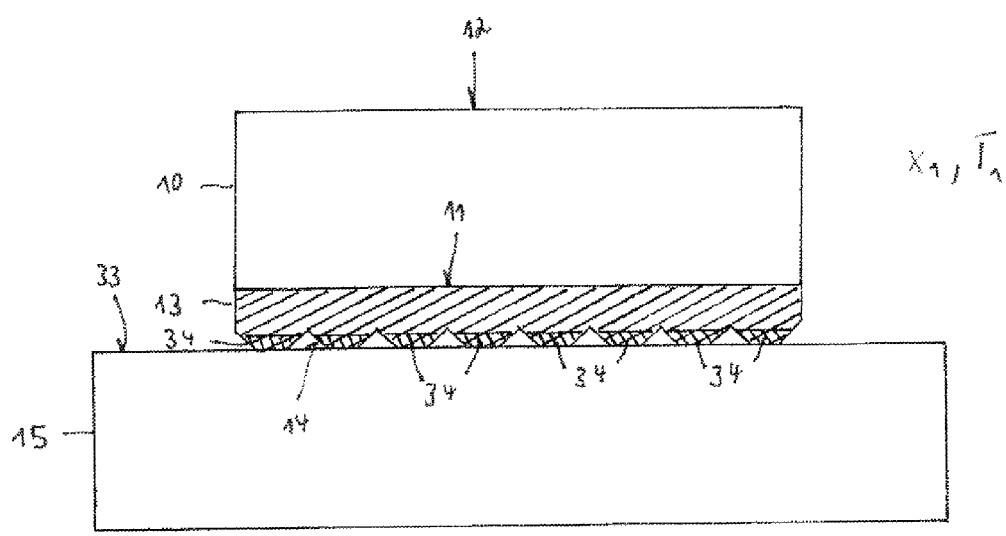

FIG. 7C schematically illustrates that the die bonder 30 is released from the semiconductor chip 10, and subsequently the carrier 15 together with the semiconductor chip 10 are introduced into the tunnel furnace 32 to a position $x_1$ (see also the temperature profile in FIG. 6). At the position $x_1$ the solder material 13 is exposed to a temperature $T_1$ which is lower than the melting temperature $T_{melt}$ of the solder material 13 (the melting temperature $T_{melt}$ of the solder material 13 is indicated in FIG. 6). The temperature $T_1$ causes solid state diffusion at the interface between the solder material 13 and the carrier 15 and leads to the formation of an intermetallic phases 34. The intermetallic phases 34 at the interface between the solder material 13 and the carrier 15 have a melting temperature, which is higher than the melting temperature $T_{melt}$ of the solder material 13.

Figure 7D:
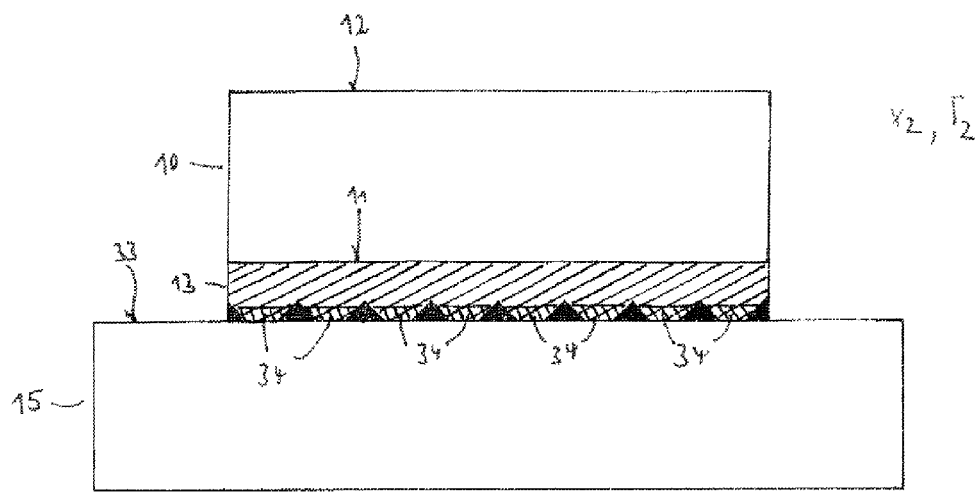

FIG. 7D schematically illustrates the semiconductor chip 10 and the carrier 15 at a position $x_2$ in the tunnel furnace 32. At the position $x_2$ the solder material 13 is exposed to a temperature $T_2$ which is higher than the melting temperature $T_{melt}$ of the solder material 13, which causes the remaining solder material 13 to melt. The intermetallic phases 34, however, do not melt at the temperature $T_2$ and thus hold the semiconductor chip 10 in place during this process step. The temperature $T_2$ may be 10-20° C. higher than the melting temperature $T_{melt}$ of the solder material 13, i.e., the temperature $T_2$ may be in the range from $T_{melt}$+10° C. to $T_{melt}$+20° C. In particular, the temperature $T_2$ may be higher than $T_{melt}$+20° C. For example, if tin is used as the solder material 13, which has a melting temperature $T_{melt}$ of 232° C., the temperature $T_2$ may be around 250° C.

Figure 7E:
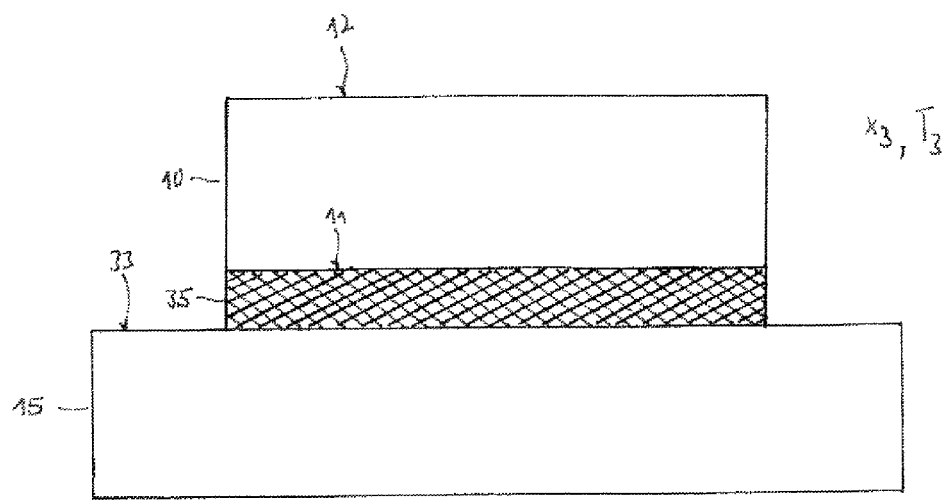

FIG. 7E schematically illustrates the semiconductor chip 10 and the carrier 15 at a position $x_3$ in the tunnel furnace 32. At the position $x_3$ the solder material 13 is exposed to a temperature $T_3$ which is higher than the melting temperature $T_{melt}$ of the solder material 13. All the low-melting solder material 13 has completely transformed at this stage, i.e., it has passed completely into an intermetallic phase 35. The metallic joint between the semiconductor chip 10 and the carrier 15 produced by the intermetallic phase 35 is able to withstand high temperatures, is highly mechanically stable and exhibits a high electrical and thermal conductivity.

The time the semiconductor chip 10 and the carrier 15 are exposed to the temperature profile of FIG. 6 in the tunnel furnace 32 may be higher than 10 s and, in particular, higher than 60 s. It may be provided that the temperature in the tunnel furnace 32 is lower than $T_{melt}$+100° C. or $T_{melt}$+50° C. or $T_{melt}$+30° C. or $T_{melt}$+25° C. or $T_{melt}$+20° C., wherein $T_{melt}$ is the melting temperature of the used solder material 13. The temperature in the tunnel furnace 32 may, for example, be lower than 800° C. or 700° C. or 600° C. or 500° C. or 400° C. or 300° C. Due to the low temperature which is necessary to bond the semiconductor chip 10 to the carrier 15, only a little stress is induced into the system of semiconductor chip 10 and carrier 15, which leads to an increased reliability. Moreover, the low temperatures lead to only a little thermal expansion of the carrier 15 and thus ensures an accurate positioning and aligning of the semiconductor chip 10. In addition, the production costs are reduced because it is not necessary that the solder material 13 is highly enriched with gold. The methods described herein also allow a lead-free chip mounting.

Figure 8:
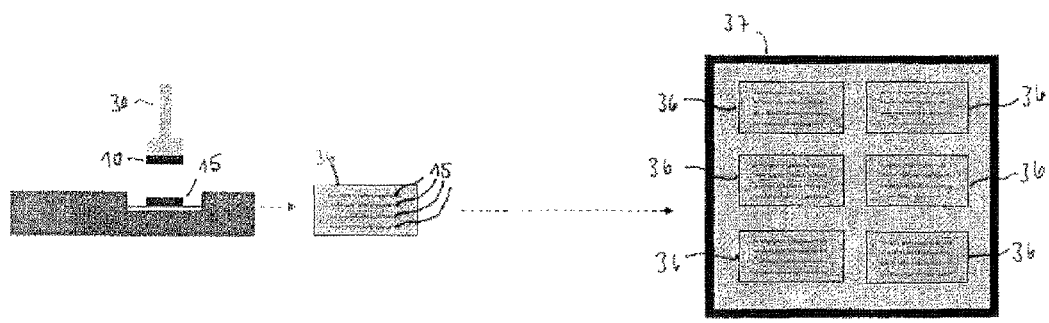
FIG. 8 illustrates a schematic view of an embodiment of a method for mounting semiconductor chips on carriers using a batch anneal process in a furnace.

FIG. 8 illustrates a schematic view of a further method for mounting the semiconductor chip 10 on the carrier 15. Similar to the method of FIG. 6, the die bonder 30 picks up the single semiconductor chip 10 and bonds the semiconductor chip 10 onto the carrier 15 by applying a force F as described above in connection with FIGS. 7A-7B. Thereafter, the carrier 15 and the semiconductor chip 10 are not passed through the tunnel furnace 32, but they are placed in a magazine 36. Further carriers 15 with attached semiconductor chips 10 may be placed in the magazine 36 as well. Subsequently, the magazine 36 and possibly further magazines 36 are placed in a furnace 37 where a temperature profile as illustrated in FIG. 6 is applied to the solder material 13 at the interface between the semiconductor chips 10 and the carriers 15.

Figure 9:
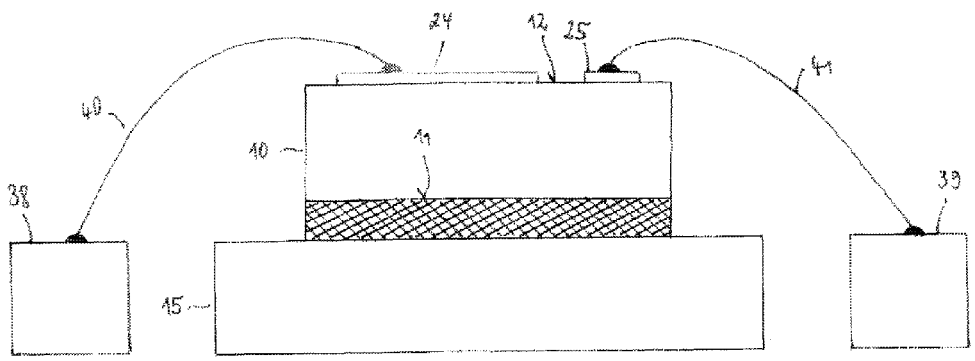
FIG. 9 illustrates a cross-sectional view of one embodiment of a power semiconductor chip mounted on a leadframe.

FIG. 9 schematically illustrates an embodiment where the carrier 15 is a die pad of a leadframe. The semiconductor chip 10 is attached with its first main surface 11 to the surface 33 of the carrier 15 as illustrated in FIG. 7E. In this embodiment, the semiconductor chip 10 is a power MOSFET with a source electrode 24 and a gate electrode 25 located on its second main surface 12. The leadframe further includes leads or pads 38 and 39. The source electrode 24 and the gate electrode 25 are electrically coupled to the leads or pads 38 and 39 by means of bond wires 40 and 41, respectively, or any other appropriate coupling means, such as metallic clips or layers. The leads or pads 38 and 39 may have the function of external contact elements. In addition, the semiconductor chip 10 may be covered with an encapsulation material.

While a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   forming a layer of solder material on a semiconductor chip, the layer of solder material having a first main surface and a second main surface, the first main surface being adjacent the semiconductor chip and the second main surface comprising a rough surface;
   pressing the second main surface of the layer of solder material directly on a substantially smooth surface of a carrier at a first temperature below a melting temperature of the solder material;
   applying a second temperature to the layer of solder material, wherein applying the second temperature to the layer of solder material comprises heating the solder material to a temperature that is below the melting temperature of the solder material thereby forming intermetallic phases between a first portion of the layer of solder material and the substantially smooth surface of the carrier; and
   heating the layer of solder material to a third temperature that is higher than the melting temperature of the solder material but lower than a melting temperature of the intermetallic phases thereby melting a second portion of the layer of solder material.

2. The method of claim 1, wherein the carrier is a leadframe.

3. The method of claim 1, wherein the semiconductor chip is a power semiconductor chip.

4. The method of claim 1, wherein the second temperature is lower than 600° C.

5. The method of claim 4, wherein applying the second temperature comprises applying the second temperature for at least 10 minutes.

6. The method of claim 1, wherein applying the second temperature to the solder material occurs after the semiconductor chip has been fixed on the carrier.

7. The method of claim 1, further comprising moving the carrier forward by a step motor after pressing the semiconductor chip on the carrier.

8. The method of claim 1, wherein a yield stress of the solder material is in a range between 10 MPa and 200 MPa.

9. The method of claim 1, wherein a yield strength of the solder material is in a range between 10 MPa and 200 MPa.

10. The method of claim 1, wherein the third temperature is lower than 600° C.

11. The method of claim 1, wherein the third temperature is lower than the melting temperature of the solder material plus 50° C.

12. The method of claim 1, wherein applying the third temperature to the solder material is performed after applying the second temperature to the solder material.

13. A method, comprising:
   forming a layer of solder material on a semiconductor chip, the layer of solder material having a main surface with a roughness of at least 1 µm;
   placing the semiconductor chip directly on a leadframe with a substantially smooth surface at a first temperature below a melting temperature of the solder material such that the main surface of the layer of solder material faces the leadframe;
   applying a second temperature to the solder material after the placement of the semiconductor chip on the leadframe, wherein applying the second temperature to the solder material comprises forming intermetallic phases between a first portion of the layer of solder material and the substantially smooth surface of the leadframe; and
   heating the layer of solder material to a third temperature that is higher than the melting temperature of the solder material but lower than a melting temperature of the intermetallic phases thereby melting a second portion of the layer of solder material.

14. The method of claim 13, wherein placing the semiconductor chip on the leadframe comprises pressing the semiconductor chip on the leadframe with at least 1 Newton per $mm^2$ of surface area of the main surface.

15. The method of claim 13, wherein placing the semiconductor chip on the leadframe comprises forming a mechanical connection between the semiconductor chip and the leadframe by deforming the solder material locally.

16. The method of claim 13, wherein the third temperature is lower than the melting temperature of the solder material plus 50° C.

17. A method comprising:
   placing a chip on a carrier, the chip comprising a solder layer having a rough surface;
   forming intermetallic phases between a first portion of the solder layer and the carrier by applying a temperature to the carrier and the solder layer below a melting temperature of the solder layer; and
   forming an electrical connection by melting a second portion of the solder layer,
   wherein melting the second portion of the solder layer comprises not melting the first portion.

18. The method of claim 17, further comprising forming a mechanical connection between the chip and the carrier by deforming the solder layer.

19. The method of claim 17, wherein the carrier is a leadframe and wherein the chip is a power semiconductor chip.

20. A method comprising:
   placing a chip on a carrier, the chip comprising a solder layer having a rough surface comprising peaks;
   forming a mechanical connection between the chip and the carrier by deforming portions of the peaks by applying a first temperature below a melting temperature of a solder material of the solder layer;
   forming intermetallic phases between a first region of the solder layer and a first region of the carrier by applying a second temperature below the melting temperature of the solder material; and
   forming an electrical connection by melting a second region of the solder layer by applying a third temperature above the melting temperature of the solder material but below a melting temperature of the intermetallic phases.

21. The method of claim 20, wherein applying the first temperature below the melting temperature of the solder material comprises applying no heat.

22. The method of claim 20, wherein forming the mechanical connection comprises forming a form-closed joint.

23. The method of claim 20, wherein forming the mechanical connection comprises moving solder material of the solder layer into grooves of the surface of the carrier.

24. The method of claim 20, wherein the second temperature is applied for a first period of time, and wherein the third temperature is applied for a second period of time.

* * * * *